US009368275B2

(12) United States Patent
McBee et al.

(10) Patent No.: US 9,368,275 B2
(45) Date of Patent: Jun. 14, 2016

(54) ADJUSTABLE OVERHEAD CONDUCTOR MONITORING DEVICE

(71) Applicant: COOPER TECHNOLOGIES COMPANY, Houston, TX (US)

(72) Inventors: Bruce W. McBee, Brookfield, WI (US); Gregg James Haensgen, Menomonee Falls, WI (US); John Fredrick Banting, Waukesha, WI (US); William J. Kostolni, Crivitz, WI (US); Bryan C. Cochran, Lakeville, MN (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 0 days.

(21) Appl. No.: 14/297,364

(22) Filed: Jun. 5, 2014

(65) Prior Publication Data

US 2014/0347037 A1  Nov. 27, 2014

Related U.S. Application Data

(62) Division of application No. 13/205,829, filed on Aug. 9, 2011, now Pat. No. 8,760,151.

(60) Provisional application No. 61/372,360, filed on Aug. 10, 2010.

(51) Int. Cl.
*G01R 15/18* (2006.01)
*H01F 38/30* (2006.01)
(Continued)

(52) U.S. Cl.
CPC .............. *H01F 38/30* (2013.01); *G01R 15/183* (2013.01); *G01R 19/00* (2013.01); *G01R 21/00* (2013.01); *H01F 27/06* (2013.01); *G01R 1/22* (2013.01)

(58) Field of Classification Search
CPC .. G01R 19/2513; G01R 21/00; G01R 15/142; G01R 19/0092; G01R 19/0084; G01R 31/08; G01R 31/086; G01R 15/18; G01R 22/063; G01R 22/10; G01R 19/20; G01R 31/021; G01R 15/186; H02J 13/0086; H02J 5/005; H02J 7/025; G01D 11/30; G01D 4/002; G01D 4/006; H01R 4/28; H01R 13/6658; H01R 13/7032; H01R 43/26; H02G 1/02; H04B 2203/5433; H04B 2203/5466; H04B 3/54; H04B 2203/5458; H04B 1/581; H04L 1/0001
See application file for complete search history.

(56) References Cited

U.S. PATENT DOCUMENTS 2,273,534 A  2/1942  Mitchell
2,953,757 A  9/1960  Yarrick et al.
(Continued)

FOREIGN PATENT DOCUMENTS

EP  0589729 A2  3/1994
FR  2717582 A1  9/1995
WO  2007143378 A2  12/2007

OTHER PUBLICATIONS

"Examination Report from the Intellectual Property Office", dated Jan. 2, 2012, including Search Report, for related Taiwanese patent application No. 09614009 (5 pages).
(Continued)

*Primary Examiner* — Vinh Nguyen
(74) *Attorney, Agent, or Firm* — King & Spalding LLP

(57) ABSTRACT

An apparatus is provided for securing to and collecting power from an electrical conductor, including a current transformer comprising a core and an electrical winding that receives an induced current from magnetic flux generated according to alternating current present on the electrical conductor, and a clamping mechanism that attaches the apparatus to the electrical conductor. According to various aspects, apparatus may include a housing that encloses circuitry for monitoring conditions of the electrical conductor, where the circuitry includes one or more sensors, and wireless communications circuitry.

14 Claims, 11 Drawing Sheets

(51) Int. Cl.
  *H01F 27/06* (2006.01)
  *G01R 19/00* (2006.01)
  *G01R 21/00* (2006.01)
  *G01R 1/22* (2006.01)

(56) References Cited

U.S. PATENT DOCUMENTS

| | | |
|---|---|---|
| 3,025,512 A | 3/1962 | Bloechl |
| 3,364,481 A | 1/1968 | Fuzzell |
| 3,460,038 A | 8/1969 | Ziegler |
| 3,665,243 A | 5/1972 | Kaneda et al. |
| 3,700,967 A | 10/1972 | Hoss |
| 3,720,872 A | 3/1973 | Russell et al. |
| 3,725,846 A | 4/1973 | Strain |
| 3,735,248 A | 5/1973 | Reese |
| 3,816,816 A | 6/1974 | Schweitzer, Jr. |
| 3,995,243 A | 11/1976 | Malmborg |
| 4,000,462 A | 12/1976 | Boyd et al. |
| 4,037,155 A | 7/1977 | Ahmed |
| 4,045,726 A | 8/1977 | Sschweitzer, Jr. |
| 4,157,520 A | 6/1979 | Moates et al. |
| 4,165,528 A | 8/1979 | Schweitzer, Jr. |
| 4,288,743 A | 9/1981 | Schweitzer |
| 4,335,437 A | 6/1982 | Wilson et al. |
| 4,384,289 A | 5/1983 | Stillwell et al. |
| 4,456,873 A | 6/1984 | Schweitzer, Jr. |
| 4,466,042 A | 8/1984 | Zylstra et al. |
| 4,495,489 A | 1/1985 | Schweitzer, Jr. |
| 4,510,476 A | 4/1985 | Clatterbuck |
| 4,558,310 A | 12/1985 | McAllise |
| 4,593,276 A | 6/1986 | Aida et al. |
| 4,630,218 A | 12/1986 | Hurley |
| 4,661,813 A | 4/1987 | Mazzamauro et al. |
| 4,686,518 A | 8/1987 | Schweitzer, Jr. |
| 4,694,599 A | 9/1987 | Hart et al. |
| 4,739,149 A | 4/1988 | Nishiwaki et al. |
| 4,746,241 A | 5/1988 | Burbank, III |
| 4,758,962 A | 7/1988 | Fernandes |
| 4,794,328 A | 12/1988 | Fernandes et al. |
| 4,794,332 A | 12/1988 | Schweitzer, Jr. |
| 4,795,982 A | 1/1989 | Schweitzer, Jr. |
| 4,799,005 A | 1/1989 | Fernandes |
| 4,801,937 A | 1/1989 | Fernandes |
| 4,839,600 A | 6/1989 | Kuurstra |
| 4,847,780 A | 7/1989 | Gilker et al. |
| 4,881,028 A | 11/1989 | Bright |
| 4,886,980 A | 12/1989 | Fernandes et al. |
| 4,984,124 A | 1/1991 | Yeh |
| 5,000,462 A | 3/1991 | Trozzi |
| 5,029,039 A | 7/1991 | Yeh |
| 5,095,274 A | 3/1992 | Brokaw |
| 5,140,257 A | 8/1992 | Davis |
| 5,155,440 A | 10/1992 | Huang |
| 5,159,319 A | 10/1992 | Dunk et al. |
| 5,220,311 A | 6/1993 | Schweitzer |
| 5,241,444 A | 8/1993 | Yeh |
| 5,258,903 A | 11/1993 | Rodriguez-Cavazos |
| 5,341,088 A * | 8/1994 | Davis ........................... 324/106 |
| 5,397,982 A | 3/1995 | Van Lankvelt |
| 5,426,360 A | 6/1995 | Maraio et al. |
| 5,440,234 A | 8/1995 | Kondo |
| 5,475,371 A | 12/1995 | Dunk et al. |
| 5,485,545 A | 1/1996 | Kojima et al. |
| 5,497,096 A | 3/1996 | Banting |
| 5,537,327 A | 7/1996 | Snow et al. |
| 5,548,279 A | 8/1996 | Gaines |
| 5,559,500 A | 9/1996 | Kase |
| 5,574,387 A | 11/1996 | Petsche et al. |
| 5,576,632 A | 11/1996 | Petsche et al. |
| 5,629,870 A | 5/1997 | Farag et al. |
| 5,630,954 A | 5/1997 | Toth |
| 5,650,728 A | 7/1997 | Rhein et al. |
| 5,661,626 A | 8/1997 | Takeuchi |
| 5,675,497 A | 10/1997 | Petsche et al. |
| 5,714,886 A | 2/1998 | Harris |
| 5,726,847 A | 3/1998 | Dalstein |
| 5,734,575 A | 3/1998 | Snow et al. |
| 5,754,383 A | 5/1998 | Huppertz et al. |
| 5,784,233 A | 7/1998 | Bastard et al. |
| 5,796,631 A | 8/1998 | Iancu et al. |
| 5,805,400 A | 9/1998 | Kim |
| 5,945,820 A | 8/1999 | Namgoong et al. |
| 5,959,537 A | 9/1999 | Banting et al. |
| 6,344,748 B1 | 2/2002 | Gannon |
| 6,535,797 B1 | 3/2003 | Bowles et al. |
| 6,538,797 B1 | 3/2003 | Hunt |
| 6,587,027 B1 | 7/2003 | Nadd |
| 6,677,743 B1 | 1/2004 | Coolidge et al. |
| 6,687,574 B2 | 2/2004 | Pietrowicz et al. |
| 6,687,575 B2 | 2/2004 | Mattes et al. |
| 6,798,211 B1 | 9/2004 | Rockwell et al. |
| 6,815,932 B2 | 11/2004 | Wall |
| 6,963,226 B2 | 11/2005 | Chiang |
| 7,010,437 B2 | 3/2006 | Lubkeman et al. |
| 7,256,701 B2 | 8/2007 | Kono et al. |
| 7,274,186 B2 | 9/2007 | Yakymyshyn et al. |
| 7,282,944 B2 | 10/2007 | Gunn et al. |
| 7,312,603 B2 | 12/2007 | Luo et al. |
| 7,312,686 B2 | 12/2007 | Bruno |
| 7,382,272 B2 | 6/2008 | Feight |
| 7,398,097 B2 | 7/2008 | Parkulo |
| 7,453,267 B2 | 11/2008 | Westbrock, Jr. et al. |
| 7,495,574 B2 | 2/2009 | Rocamora et al. |
| 7,518,529 B2 | 4/2009 | O'Sullivan et al. |
| 7,557,563 B2 | 7/2009 | Gunn et al. |
| 7,576,548 B1 | 8/2009 | Lo et al. |
| 7,609,158 B2 | 10/2009 | Banting et al. |
| 7,656,763 B1 | 2/2010 | Jin et al. |
| 7,691,538 B2 | 4/2010 | Takahashi |
| 7,714,735 B2 | 5/2010 | Rockwell |
| 7,733,094 B2 | 6/2010 | Briight et al. |
| 7,733,224 B2 | 6/2010 | Tran |
| 7,746,241 B2 | 6/2010 | Feight et al. |
| 7,777,605 B2 | 8/2010 | Zumoto et al. |
| 7,864,012 B2 | 1/2011 | Merck et al. |
| 7,868,776 B2 | 1/2011 | Kesler et al. |
| 7,930,141 B2 | 4/2011 | Banting |
| 7,956,763 B2 | 6/2011 | Mies |
| 8,342,494 B2 | 1/2013 | Ricci et al. |
| 8,395,372 B2 | 3/2013 | Harlev et al. |
| 8,441,817 B2 | 5/2013 | Paajarvi |
| 8,536,857 B2 | 9/2013 | Nero, Jr. |
| 2004/0037018 A1 * | 2/2004 | Kim ................................ 361/42 |
| 2004/0183522 A1 | 9/2004 | Gunn et al. |
| 2005/0017751 A1 | 1/2005 | Gunn et al. |
| 2005/0146220 A1 | 7/2005 | Hamel et al. |
| 2005/0151659 A1 | 7/2005 | Donovan et al. |
| 2006/0063522 A1 | 3/2006 | McFarland |
| 2006/0187074 A1 | 8/2006 | O'Sullivan et al. |
| 2006/0279910 A1 | 12/2006 | Gunn et al. |
| 2007/0059986 A1 | 3/2007 | Rockwell |
| 2007/0086135 A1 | 4/2007 | Swartzendruber et al. |
| 2007/0136010 A1 | 6/2007 | Gunn et al. |
| 2007/0270114 A1 | 11/2007 | Kesler et al. |
| 2007/0285201 A1 | 12/2007 | Zumoto et al. |
| 2008/0001735 A1 | 1/2008 | Tran |
| 2008/0012702 A1 | 1/2008 | Feight et al. |
| 2008/0077336 A1 | 3/2008 | Fernandes |
| 2008/0284585 A1 | 11/2008 | Schweitzer, III et al. |
| 2009/0015239 A1 | 1/2009 | Georgiou et al. |
| 2009/0115426 A1 | 5/2009 | Muench, Jr. et al. |
| 2009/0119068 A1 | 5/2009 | Banting |
| 2009/0231764 A1 | 9/2009 | Banting et al. |
| 2010/0013457 A1 | 1/2010 | Nero, Jr. |
| 2010/0085036 A1 | 4/2010 | Banting et al. |

OTHER PUBLICATIONS

"Research for Structure of Wireless Sensor Networks based on power transmission hallway", Peng Zheng et al., Engineering Journal of Wuhan University, vol. 39, No. 3, Jun. 30, 2006, pp. 12-16, cited in an office action dated Nov. 9, 2011 for related Chinese patent application No. 200780048163.5 (6 pages).

(56) References Cited

OTHER PUBLICATIONS

The Institute of Electrical and Electronics Engineers, Inc., IEEE Spectrum, New Ways to Play, Electronic Music Interfaces, Dec. 1997, 3 pages.

Cooper Power Systems; Fault Indicators, S.T.A.R.™ Faulted Circuit Indicators Electrostatic Reset Type, Electrical Apparatus 320-60, May 1997, 4 pages.

Cooper Power Systems; Fault Indicators, S.T.A.R.™ Faulted Circuit Indicators Low Voltage Reset Type, Electrical Apparatus 320-50, May 1997, 4 pages.

Cooper Power Systems; Fault Indicators, S.T.A.R.™ Faulted Circuit Indicators Test Point Reset Type, Electrical Apparatus 320-40, May 1997 (4 pages).

Cooper Power Systems; Fault Indicators, S.T.A.R™ Type ER Faulted Circuit Indicator Installation Instructions, Service Information S320-60-1, Dec. 1997, 2 pages.

Cooper Power Systems; Fault Indicators, S.T.A.R.™ Type LV Faulted Circuit Indicator Installation Instructions, Service Information S320-50-1, May 1997, 4 pages.

Cooper Power Systems; Fault Indicators, S.T.A.R.™ Type TPR Faulted Circuit Indicator Installation Instructions, Service Information S320-40-1, Dec. 1997, 3 pages.

Cooper Power Systems; S.T.A.R.™ Faulted Circuit Indicators, Low Voltage Reset Type, Bulletin No. 97035, Jan. 1998, 2 pages.

Cooper Power Systems; S.T.A.R.™ Faulted Circuit Indicators, Test Point Reset Type, Bulletin No. 97034, Jan. 1998, 2 pages.

\* cited by examiner

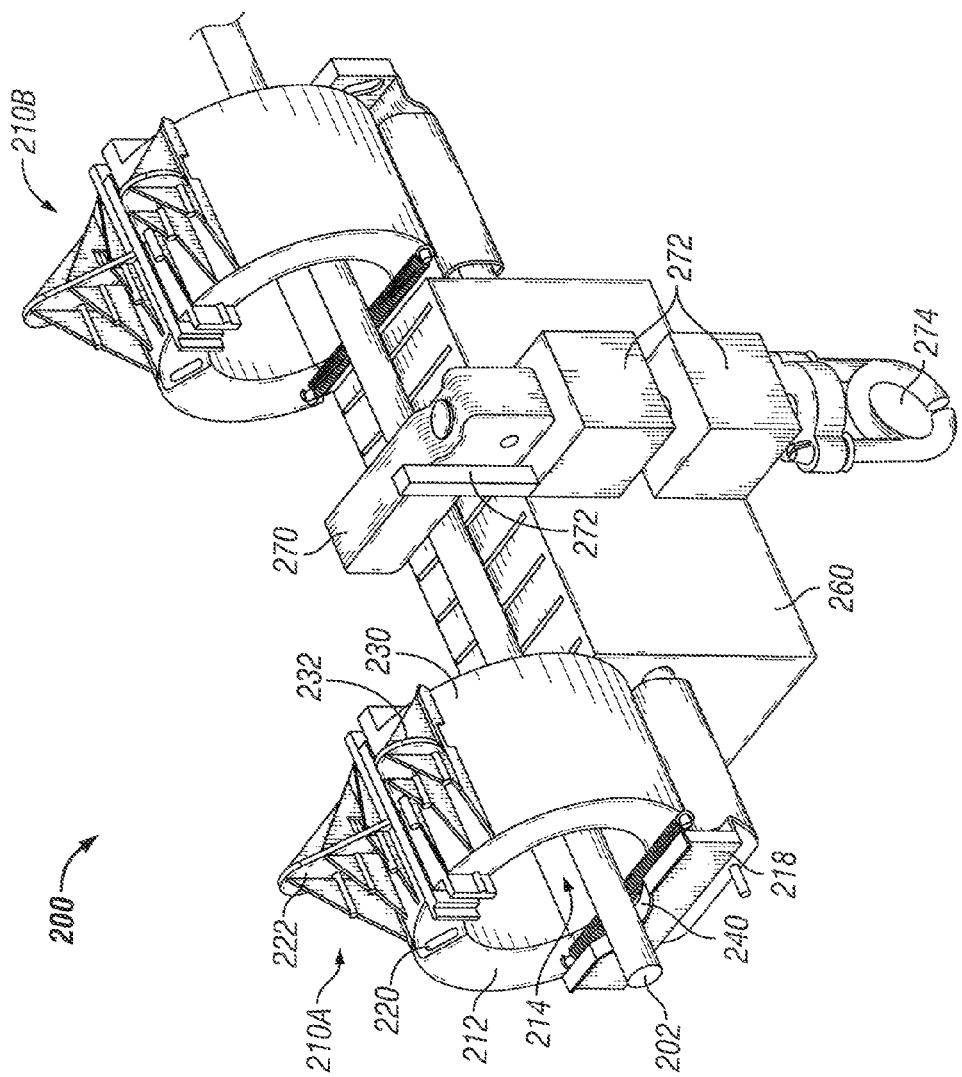

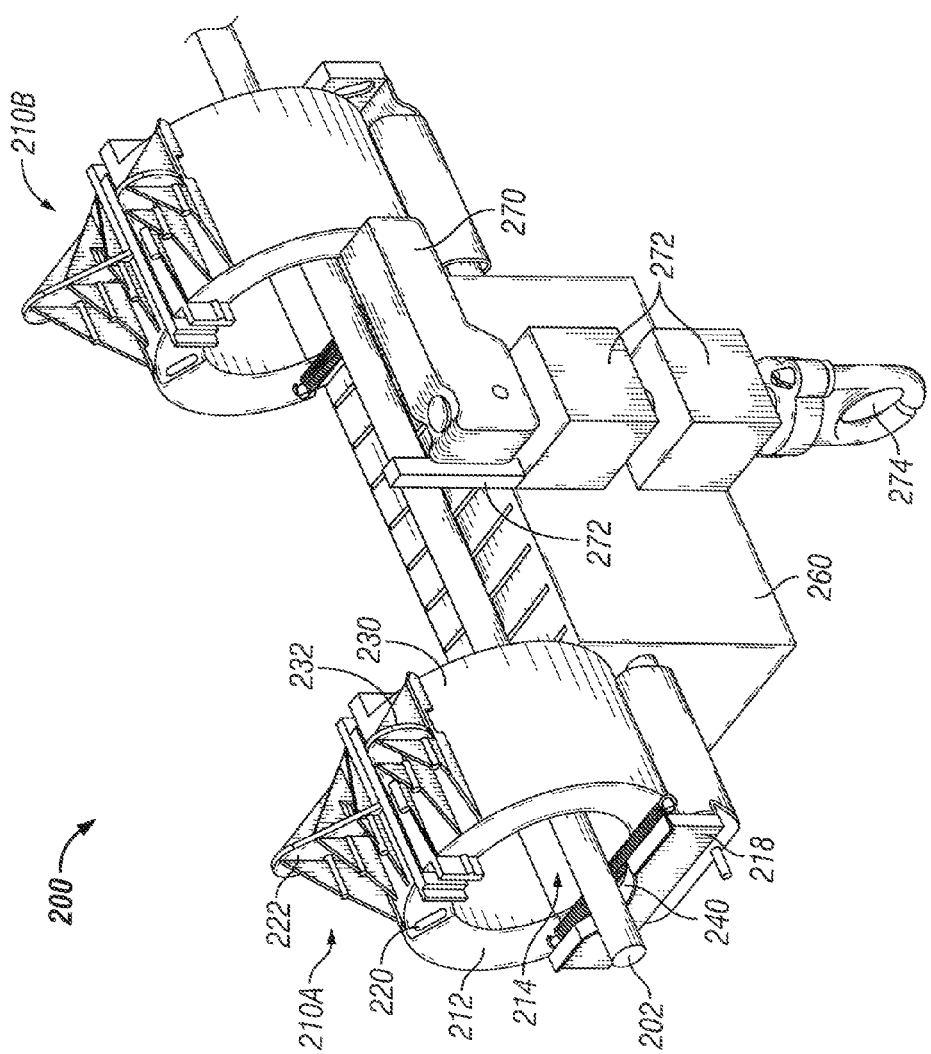

ADJUSTABLE OVERHEAD CONDUCTOR MONITORING DEVICE

CROSS-REFERENCE TO RELATED APPLICATIONS

This application is a divisional application of and claims priority under 35 U.S.C. §121 to U.S. patent application Ser. No. 13/205,829, entitled "Adjustable Overhead Conductor Monitoring Device" and filed on Aug. 9, 2011, now U.S. Pat. No. 8,760,151; which claims priority under 35 U.S.C. §119 to U.S. Provisional Application No. 61/372,360, filed Aug. 10, 2010, entitled "Mounting Methods for Overhead Device," the entire contents of which is hereby incorporated herein by reference. This application is related to U.S. patent application Ser. No. 11/982,588, entitled "Communicating Faulted Circuit Indicator Apparatus and Method of Use Thereof," filed Nov. 2, 2007, now U.S. Pat. No. 7,930,141; U.S. patent application Ser. No. 13/205,812, entitled "Apparatus and Method for Mounting an Overhead Monitoring Device," filed on Aug. 9, 2011, now U.S. Pat. No. 79,000,875; and U.S. patent application Ser. No. 13/205,824, entitled "Apparatus and Method for Mounting an Overhead Monitoring Device," filed on Aug. 9, 2011, now U.S. Pat. No. 78,760,254. The complete disclosure of each of the foregoing priority and related applications are hereby fully incorporated herein by reference.

TECHNICAL FIELD

The present invention generally relates to power line monitoring devices, reliably securing a power line monitoring device to a power line, and reliably powering a power line monitoring device by inductive coupling from a power line.

BACKGROUND

Modern electrical power distribution systems include many independent devices that measure and control the distribution of power from power generating facilities to meter access points. Typically, a "transmission system" transports power from a power generation facility to a substation, and a "distribution system" distributes the generated power from the substation to an end point. The transmission and distribution systems may each include one or more "monitoring devices" that measure, monitor, and/or control power flow. For example, a monitoring device may include a faulted circuit indicator ("FCI"), a current sensor, and/or a voltage sensor that measure, monitor, and/or control power flow on a power line conductor of a transmission or distribution system.

It is desirable to communicate information measured by a monitoring device to a remote facility, such as an automatic metering infrastructure (AMI), where it can be analyzed along with information measured by other monitoring devices. To this end, monitoring devices may include wireless communication radios, for example, to wirelessly communicate measured information. Thus, monitoring devices require a power source to supply power to circuitry associated with wireless communication. However, when placed upon a conductor of a distribution system, a power source is not generally available to a monitoring device. Traditional approaches to powering monitoring devices have involved the use of batteries or solar cells, which have a limited lifetime and are unreliable and expensive. Batteries have limited power and cannot provide the ongoing power required monitoring devices on power lines. Solar cells can replenish power in storage devices, but are unreliable due to contamination, weather, snow, and other factors.

Further, a monitoring device should include a means to be securely attached to a power line, even in varying environmental conditions throughout the calendar year. Additionally, it would be desirable for a monitoring device to be configured such that it may be secured to a power line by a field technician without de-energizing the power line, to minimize disruptions in electrical service distribution.

Therefore, a need exists in the art for an improved monitoring device having a means to be reliably secured to a power line and further including a suitable power source.

SUMMARY

An apparatus is provided for securing to and collecting power from an electrical conductor, including a current transformer comprising a core and an electrical winding that receives an induced current from magnetic flux generated according to alternating current present on the electrical conductor, and a clamping mechanism that attaches the apparatus to the electrical conductor. According to various aspects, apparatus may include a housing that encloses circuitry for monitoring conditions of the electrical conductor, where the circuitry includes one or more sensors, and wireless communications circuitry.

In other aspects, an apparatus may include a circuit configured to convert induced current into energy to be stored for consumption by sensors and wireless communications circuitry, and a current transformer including first and second magnetic core sections integrated with the apparatus to be separable or integrated with a clamping mechanism. The apparatus may also include one or more springs to spring bias the first and second magnetic core sections to a closed position and a clip that secures the first and second sections in a locked position. In alternative aspects, the apparatus may include an adjustment rod attached to the first and second sections of the current transformer, the adjustment rod being formed to open and close the current transformer based on rotation of the adjustment rod. In additional aspects, the apparatus may include a wire clamp including clamp arms, or a securing lever.

In other aspects, an apparatus is provided for collecting power from an electrical conductor including a current transformer comprising a core that receives an induced magnetic flux generated according to alternating current present on the electrical conductor, a clamping mechanism that attaches to the electrical conductor, and a housing including a cavity that encloses circuitry that monitors conditions of the electrical conductor, where the circuitry includes one or more sensors and indicators. In other aspects, the apparatus may include a battery, where the current transformer further includes an electrical winding that receives an induced current from magnetic flux generated according to alternating current present on the electrical conductor, and the circuitry further includes a circuit configured to convert the induced current into energy to be stored in the battery for consumption by the one or more sensors and indicators.

In other aspects, an apparatus is provided for collecting power from an electrical conductor including a current transformer comprising a core and a winding that receives an induced current from magnetic flux generated according to alternating current present on the electrical conductor, a clamping mechanism that attaches to the electrical conductor, a housing including a cavity, and circuitry disposed within the cavity that monitors conditions of the electrical conductor, the circuitry including a circuit configured to convert the induced current into energy to be stored in a battery for consumption by one or more sensors and indicators.

BRIEF DESCRIPTION OF THE DRAWINGS

For a more complete understanding of the invention and the advantages thereof, reference is now made to the following description, in conjunction with the accompanying figures briefly described as follows:

FIG. 2A illustrates a top view of a monitoring device in an open position according to an embodiment of the present invention;

FIG. 2B illustrates a top view of a monitoring device in a closed position according to an embodiment of the present invention;

DETAILED DESCRIPTION OF EXAMPLE EMBODIMENTS

Figure 1:
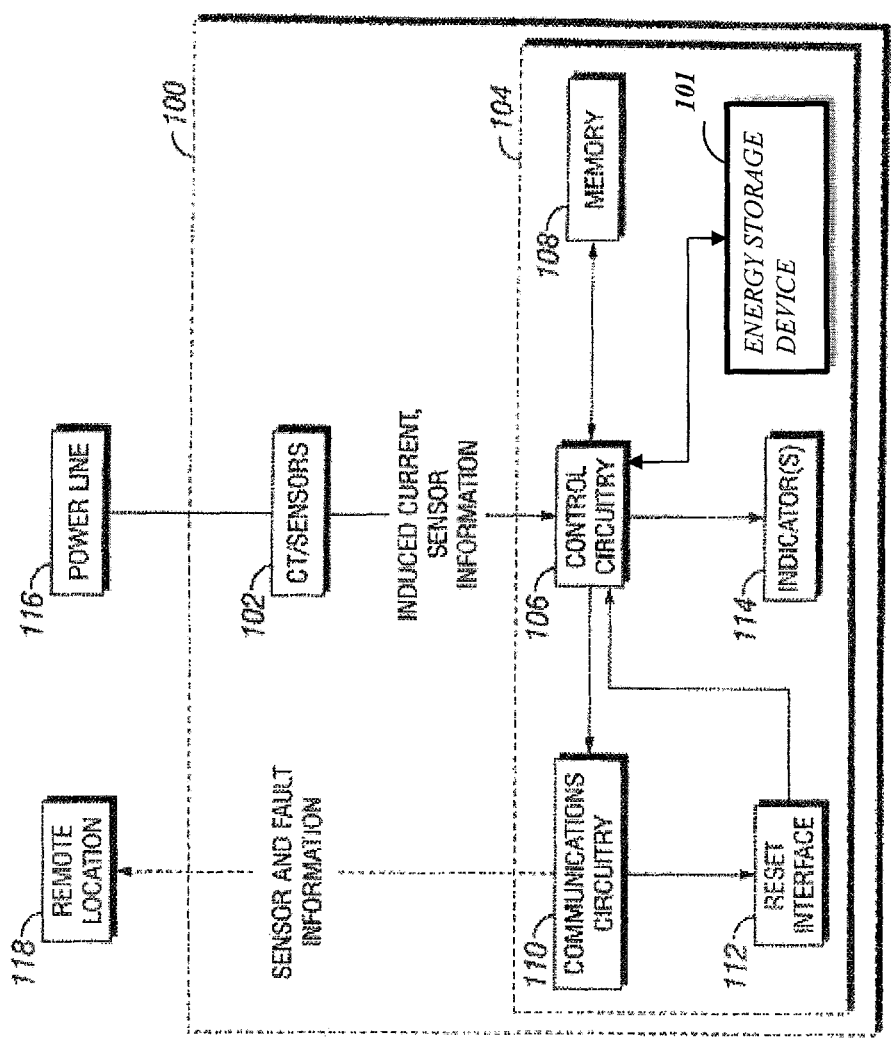
FIG. 1 illustrates a block diagram of a monitoring device according to an embodiment of the present invention.

The present invention is directed to a monitoring device that can be easily secured to a power line without de-energizing or compromising the integrity of the power line. According to the present invention, a monitoring device including a current transformer ("CT") that captures energy via magnetic flux from the power line is secured to a power line. Circuitry associated with the CT converts the energy captured by the CT into energy that may be used by one or more electrical circuits and devices. For example, the energy may power one or more microcontrollers, sensors, wireless communication devices, and/or other circuitry and devices.

The one or more sensors of the monitoring device monitor and collect information related to the power line. For example, the sensors may collect information regarding a current on the power line, a voltage on the power line, a temperature of the power line, and/or information regarding whether a vibration is present on the power line. Among embodiments of the present invention, the one or more wireless communications devices communicate at least a portion of the collected information to a remote location. For example, the information can be communicated to an automatic metering infrastructure ("AMI") of a central utility company associated with the power line and/or monitoring device.

In one aspect, the circuitry associated with the monitoring device may include a ground reference point electrically coupled to the power line when the power line monitoring device is secured to the power line. Thus, embodiments of the present invention may include coupling the monitoring device to a ground reference point via a coupling to a power line. In this embodiment, the monitoring device and associated circuitry of the monitoring device maintains a voltage potential of the power line as a ground or reference voltage. Accordingly, a substantially equalized or uniform electric field is present around the monitoring device. As compared to a monitoring device without the equalized and uniform electric field, a monitoring device relying on a power line as a ground or reference voltage is able to conduct wireless communications with reduced noise and interference.

A voltage potential of the monitoring device may be substantially different than a voltage potential of a power line prior to securing the monitoring device to the power line. As such, certain embodiments of the present invention include a pad of semi-conductive material disposed between the power line and the monitoring device to slow a rate of change of the difference in voltage potential between the power line and the monitoring device, when securing the monitoring device to the power line. Slowing down the rate of change can minimize the risk of corona discharge upon securing and/or electrically coupling the monitoring device to the power line.

In certain embodiments of the invention, the CT of the monitoring device includes two "split core" sections which allow the CT to be easily installed having a power line extending through the CT without de-energizing the power line. At least one of the split core sections includes an electrical wire winding wrapped around the section. Thus, when the CT is mounted in proximity to a power line, an alternating magnetic flux field caused by an alternating current conducted by the power line couples to the CT and the electrical wire winding of the CT. An induced current is thus generated in the electrical wire winding of the CT, which can be converted into power for circuitry associated with the monitoring device.

To obtain power from the induced current generated in the electrical winding of the CT, the circuitry associated with the monitoring device may include a pre-regulator circuit that receives the induced current from the CT and develops a voltage matched to a power curve of the CT. In this case, an output of the pre-regulator is coupled to a switching regulator that regulates the voltage to an output voltage suitable for the circuitry associated with the monitoring device, such as a wireless communications device or other device. The circuitry may also include an energy storage device 101, such as a rechargeable battery or a supercapacitor, that provides power to the circuitry when the power line does not carry an adequate alternating current to induce an adequate current in the electrical wire winding of the CT.

The monitoring device and its associated circuitry are designed to withstand harsh environments and provide reliable operation. For example, the CT may be protected by a housing, epoxy coating, or other means. In addition, a housing of the circuitry associated with the monitoring device may be designed to protect the circuitry and other components from the environment. At least some of the components of the monitoring device may be constructed from materials suitable to withstand exposure to rain, ice, snow, sun, wind, and other environmental conditions.

According to certain aspects of the present invention, a monitoring device is designed such that it may be securely attached to a power line by a field technician without de-energizing the power line. That is, the monitoring device may be attached to the power line using only a hotstick without de-energizing the power line and interrupting power distribution services. Further, the monitoring device of the present invention is designed to provide a secure attachment to the power line, so that it is unlikely that the monitoring device would be unsecured from the power line due to wind, rain, hail, or other environmental conditions.

Turning now to the drawings, in which like numerals indicate like elements throughout, embodiments of the present invention are described in additional detail.

FIG. 1 is a block diagram illustrating a monitoring device 100, in accordance with certain embodiments of the present invention. The monitoring device 100 includes CT and sensors 102 and circuitry 104 associated with the monitoring device. As an example of the circuitry 104 associated with the monitoring device, the circuitry 104 includes control circuitry 106, communications circuitry 110, a memory 108, a reset interface 112, and one or more indicators 114. It is noted that the circuitry 104 illustrated in FIG. 1 is provided as an example only, and the circuitry 104 may include additional circuitry or omit some or all of the components 106, 108, 110, 112, and 114.

Generally, as described in further detail below, the monitoring device 100 may be securely attached to the power line 116 according to a clamping or other mechanical fixing means that ensures a strong mechanical connection between the monitoring device 100 and the power line 116. The term "power line" is used herein to refer to any type of electrical conductor that transmits electricity from one location to another. For example, the power line 116 may include one or more above or underground utility cables that carry and distribute electrical power.

The monitoring device is powered according to an induced current generated in an electrical wire winding of the CT, and the control circuitry 106 may include a pre-regulator circuit that receives the induced current from the CT and develops a voltage based on the induced current. The sensors measure conditions on the power line 116. For example, the sensors may measure a voltage and current present on the power line 116 in real time or near-real time. Among embodiments of the present invention, various types of sensors may be used to measure parameters related to conditions of the power line 116, conditions of the monitoring device 100, or the environment of the power line 116 and the monitoring device 100, such as line temperature, line tilt, ambient temperature, wind speed, liquid levels of electrical components, dissolved gas content or pressure from a monitored transformer, battery status, frequency, harmonics, zero crossings, vibration, and/or power factor. The sensors communicate measurements to the control circuitry 106 for processing. The control circuitry 106 may also store the measurements in the memory 108, provide external indications of the measurements via the indicators 114, and communicate the measurements via the communications circuitry 110.

In certain embodiments, the control circuitry 106 includes a microcontroller programmed to analyze sensor data and to respond according to various events or states. For example, the controller 104 may be configured to process and analyze sensor data, store the sensor data in the memory 108, transmit the sensor data to a remote location 118 via the communications circuitry 110, and provide one or more indications of the sensor data via the indicators 114. That is, the control circuitry 106 may be configured to provide an indication that a fault condition has occurred on the power line 116, based on sensor data.

The control circuitry 106 includes a regulated power supply that takes advantage of an optimal power point of the CT, which is based on a permeability of magnetic core material of the CT, the cross-sectional area of the magnetic core, the number of turns of the electrical wire winding wrapped around the magnetic core, the air gap separating the magnetic core halves, the resonant frequency of the circuit, and other factors such as a wire resistance of the electrical wire winding, switching efficiencies, and other electrical factors.

Energy captured by the CT may be stored in an energy storage device such as one or more batteries or capacitors.

The indicators 114 may include one or more light emitting diodes (LEDs) or other indicators, and the indication may include lighting the LEDs to give notice to a field technician of the fault condition. Thus, the indicators 114 may provide a visible indication that a fault has occurred. In certain embodiments, the indicator comprises a high visibility display device, a liquid crystal display (LCD), or other similar display device. Additionally, the indicators 114 may emit an audible sound to alert a technician in a general vicinity that the monitoring device 100 has detected a fault condition.

The memory 108 may include any suitable persistent or semi-persistent memory, such as a flash-based or other type of memory. When the control circuitry 106 determines that sensor data should be recorded, such as when the sensor data indicates an unusual condition or fault, the control circuitry 106 may record the sensor data in the memory 108, along with a record of information related to the sensor data such as a time the sensor data was measured, the geographic coordinates of the monitoring device 100, ambient conditions at the time the sensor data was measured, or other similar data.

In certain embodiments, the memory 108 may also store information associated with the monitoring device 100. For example, upon installation, the memory 108 may be programmed with the global coordinates of the monitoring device 100. Alternatively, the memory 108 may store other identifying information, such as, but not limited to, a street address, a unique identifier of the monitoring device 100, utility grid coordinates, or an identifier of a nearby utility pole or other landmark.

The communications circuitry 110 includes circuitry configured to transmit data to the remote location 118. In some embodiments, the communications circuitry 110 communicates with the remote location 118 using cellular technologies such as GSM (Global System for Mobile communications) or CDMA (Code Division Multiple Access). The communications circuitry 110 may also comprise components for any number of wireless or wired communications protocols, including any of the 802.11 standards, Bluetooth (IEEE 802.15.1), ZigBee (IEEE 802.15.4), Internet Protocol, licensed or un-licensed radio, fiber, or power line carrier communications technologies.

The remote location 118 may be associated with a utility company's central office and includes the capability of simultaneously monitoring communication feeds from numerous monitoring devices 100 and communicating information from those feeds to an entity responsible for repair and maintenance of transmission and distribution systems. In this embodiment, the remote location 118 may comprise a central server connected to a utility company's outage management system. Upon receiving information indicating fault or sensor data from a monitoring device 100, the server processes and transmits the information to the outage management system. Either the server or the outage management system may also direct communications to the entity responsible for repair and maintenance systems associated with the fault or sensor data.

The reset interface 112 may include one or more reset operations, such as an indicator reset and a memory reset. In this context, the indicator reset operation removes a fault indication provided on the indicators 114, while the memory reset operation clears at least some sensor data from the memory 108. The memory reset operations may specify certain parameters to be cleared. For example, the memory reset operation may specify that only sensor data recorded before a certain date should be cleared, that all sensor data should be cleared, that sensor data and information relating to the monitoring device 100 should be cleared, that all data other than information relating to the monitoring device 100 should be cleared, and/or other similar parameters.

In certain embodiments, the control circuitry 106 may be programmed to respond to a correction of a previously identified fault event by executing an indicator reset operation but not a memory reset instruction. In this case, a record of the fault event, as well as the conditions that accompanied the fault event, will remain in memory 108 even though the indication of the fault is cleared from the indicators 114. Additionally, the reset interface 112 may receive a reset instruction directly from an "on-site" field technician via one or more buttons of the monitoring device 100, from an input device connected to the monitoring device 100, or from other similar input methods or devices.

Figure 2C:
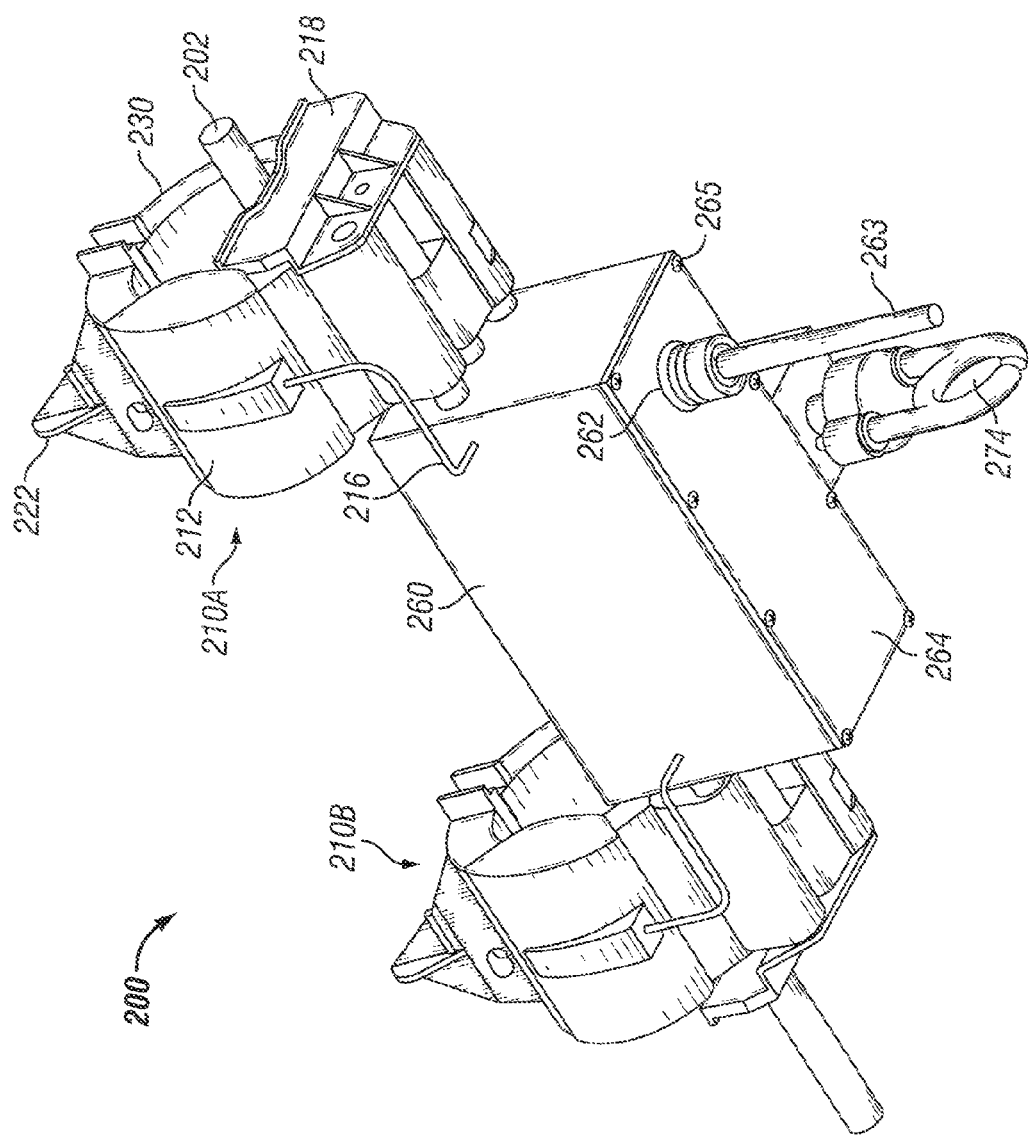
FIG. 2C illustrates a bottom view of a monitoring device according to an embodiment of the present invention.

Turning now to FIGS. 2A-2C, a physical structure of a monitoring device 200 according to one embodiment of the present invention is described in detail. FIG. 2A illustrates a perspective view of a top of the monitoring device 200 in an open position, FIG. 2B illustrates a perspective view of the top of the monitoring device 200 in a closed position, and FIG. 2C illustrates a perspective view of a bottom of the monitoring device 200.

According to the example embodiment illustrated among FIGS. 2A-C, the monitoring device 200 includes current transformers ("CTs") 210A and 210B, a housing 260, and a wire clamp or securing lever 270. It is noted that the CTs 210A and 210B comprise the same elements, and embodiments of the monitoring device 200 may include additional or fewer CTs. FIGS. 2A-C also illustrate an electrical conductor 202. The conductor 202 may include a power or neutral line of an electricity distribution system, for example. According to aspects of the present invention, the monitoring device 200 is designed to be supportable by the conductor 202, so that the monitoring device 200 may be safely and reliably supported by the conductor 202.

Each CT 210A and 210B includes CT arms 220 and 230, an end plate 218, at least one spring 240, and an electrical wire winding 212. Each CT 210A and 210B is attached to one side of the housing 260 using a mechanical or other suitable attaching means. Each CT arm 220 and 230 comprises one half of a magnetic core. The magnetic cores of each CT 210A and 210B comprise magnetic core material such as grain-oriented steel, supermalloy, permalloy, ferrites, combinations thereof, and/or other materials known in the art to be suitable for the application as magnetic core material. In some embodiments, the magnetic core may further include an epoxy or other coating to seal and protect the magnetic core from the environment. Further, the magnetic core may be vacuum-impregnated with a varnish approximately 0.2 to 0.6 mil thick, for example, to hold laminations of the core together and protect the core from moisture. In one embodiment, the core is designed for use at an operational frequency of 60 Hz, although the core may be designed for use at other operational frequencies. The electrical wire winding 212 is wound around one or both of the CT arms 220 and 230, to capture a proportional current induced from the conductor 202 as described in further detail below.

The CT arms 220 and 230 are spring biased to remain in a closed position. To maintain the spring bias, each of the CT arms 220 and 230 includes a spring mount to attach the spring 240. FIG. 2A illustrates a spring 240 attached to one side of CT 210A, and another similar spring may be attached on another side of the CT 210A. The spring 240 maintains the CT arms 220 and 230 in a closed position with nearly no air gap between ends of the CT arms 220 and 230. Especially in the closed position, magnetic flux from the conductor 202 may be coupled into the magnetic cores of the CTs 210A and 210B and, hence, the electrical wire winding 212.

Each CT arm 220 and 230 includes a conductor entry projection 222 and 232. The entry projections 222 and 232 are formed to facilitate opening the CT arms 220 and 230. More specifically, when the CTs 210A and 210B are closed, the entry projections 222 and 232 substantially form a "V" shape which directs the conductor 202 to apply a force that opens the CT arms 220 and 230. To open the CT arms 220 and 230, the monitoring device 200 is moved so that the conductor 202 is at a position between the entry projections 222 and 232 of the CTs 210A and 210B. The monitoring device 200 may be further moved so that the conductor 202 presses between the entry projections 222 and 232 toward a center of the CTs 210A and 210B to move the CT arms 220 and 230 apart against the spring bias. Once the CT arms 220 and 230 are opened at least partially against the spring bias, the conductor 220 may enter a CT cavity 214 disposed within the CT arms 220 and 230. After the conductor 202 is within the CT cavity 214, the spring bias of the CTs 210A and 210B will re-close the CT arms 220 and 230, surrounding the conductor 202.

Current flowing through the conductor 202 generates a magnetic field that extends around the conductor 202, couples to the magnetic cores of the CTs 210A and 210B, and induces a current in the electrical wire winding 212 of each CT that is directly proportional to the current flowing through the conductor 202 and a number of turns of the electrical wire winding 212 around the CT magnetic core. It is noted that the electrical wire winding 212 may be wound or wrapped around one or both of the CT arms 220 and 230. It is further noted that each CT 210A and 210B includes both a primary winding and a secondary winding. That is, the electrical conductor 202 and electrical wire winding 212 act as primary and secondary windings, respectively. An electrical connector 216 (see FIG. 2C) routes a current induced in the electrical wire winding 212 to the housing 260. Among embodiments of the present invention, the electrical connector 216 may be flexible or disposed in a rigid structure, such as a conduit, that protects the electrical connector 216. The housing 260 is adapted to receive the electrical connector 216 without compromising the integrity of the housing 260 or any circuitry disposed within the housing 260.

The wire clamp or securing lever 270 is adjusted by a field technician to secure the monitoring device 200 to the electrical conductor 202. FIG. 2A illustrates the securing lever 270 in a closed position where the lever 270 secures the electrical conductor 202 between the securing lever 270 and the housing 260. In this position, the weight of the monitoring device 200 may be transferred to the electrical conductor 202 at the securing lever 270, and the securing lever 270 is positioned so that the electrical conductor is prevented from exiting the cavity 214 of the CTs 210A and 210B. According to the example embodiment illustrated among FIGS. 2A and 2B, the securing lever 270 is attached or secured to the housing 260 by passing through mounts 270 attached to the housing 260. As would be understood by one having skill in the art, alternative means for attaching or securing the securing lever 270 to the housing 260 are within the scope of the present invention. In operation, the securing lever 270 may be rotated between closed (see FIG. 2A) and open (see FIG. 2B) positions by a field technician according to a 90° rotation of the lever 270 using a hotstick or similar tool inserted within an eye 274 formed at one end of the securing lever 270. According to one aspect of the present invention, a bumper-post 272 is formed to extend from the mount 272. The bumper-post 272 is formed to stop the securing lever 270 at a position such that, in the closed position, the securing lever 270 and the conductor 202 cross in substantially orthogonal positions of extension. In this manner, the bumper-post 272 facilitates installation of the monitoring device 200, by ensuring that the securing lever 270 does not over-rotate past a position in which the conductor 202 is secured between the securing lever 270 and the housing 260.

The housing 260 includes an internal cavity (not shown) in which various circuitry components such as the circuitry 104 may be disposed. The housing 260 is configured to enclose and protect circuitry components from mechanical shock, wind, rain, snow, hail, and other environmental conditions. To that end, the circuitry enclosed with the housing 260 may be secured using a potting compound, glue, or any other fastening means known in the art to be suitable for the application. The housing 260 may also enclose a battery, capacitor, or other power storage device, to store power obtained by current induced in the CTs 210A and 210B. A person of ordinary skill in the art will recognize that the housing 260 may vary in shape and size. The housing 260 may be constructed from any material suitable to withstand exposure to environmental conditions, such as a synthetic plastic or semi-synthetic plastic solid material or other material known in the art to be suitable for the application. The housing 260 may include a housing cover 264 fastened to the housing 260 with fasteners 265 such as screws, plastic snaps, rivets, or other fastening means. In certain embodiments, the housing 260 may include an aperture 262 through which one or more antennas 263 may extend. The one or more antennas 263 may be associated with the communications circuitry 110 discussed above. Although FIG. 2C illustrates one antenna 263, the monitoring device 200 may comprise more than one antenna. The housing 260 may additionally include indicators positioned or mounted external or semi-external to the housing 260, such as the indicators 114 described above with reference to FIG. 1. In this context, the indicators may be disposed upon an exterior of the housing 260 to be visible to a field technician.

To install the monitoring device 200 on the conductor 202, a field technician may first adjust the securing arm 270 to be in an open position. The field technician may then move the monitoring device 200 using a hotstick so that the conductor 202 is at a position between the entry projections 222 and 232 of the CTs 210A and 210B. The monitoring device 200 may then be further moved so that the conductor 202 presses between the entry projections 222 and 232, causing the CT arms 220 and 230 to move apart against the spring bias. Once the CT arms 220 and 230 are opened, the conductor 220 may enter the CT cavity 214 disposed within the CT arms 220 and 230, and the spring bias of the CTs 210A and 210B will re-close the CT arms 220 and 230 to surround the conductor 202. Afterwards, the field technician may rotate the securing arm 270 until it stops at the bumper-post 272. When mounted on the conductor 202, the housing 260 of the monitoring device 200 hangs below the conductor 202, based on the particular arrangement and attachments among the CTs 210A and 210B, the securing lever 270, and the housing 260.

As described above, a reference or ground node of the circuitry disposed within the housing 260 may be coupled to the conductor 202, so that the circuitry maintains a reference potential with the conductor 202. As one example coupling, the ground node of the circuitry may be coupled to the conductor via the spring 240, which may contact the conductor 202. Additionally, when a field technician mounts the monitoring device 200 to the electrical conductor 202, the voltage potential of the monitoring device 200 changes to the voltage potential of the electrical conductor 202. Generally, the change in voltage potential is significant. An abrupt change in voltage potential can cause arcing between the monitoring device 200 and the electrical conductor 202, which can be harmful to the monitoring device 200. Thus, in certain embodiments, a pad of semi-conductive or resistive material may be fixed to the monitoring device 200 at a position where the electrical conductor 202 is likely to touch the monitoring device 200, to reduce or slow a change in electrical potential between the monitoring device 200 and the electrical conductor 202 when the monitoring device 200 is secured to the electrical conductor 202. For example, the pad of semi-conductive material may be placed upon or over the spring 240, the securing lever 270, the end plate 218, or at any other position of the monitoring device 200 likely to make contact with the conductor 200. In some embodiments, the semi-conductive pad comprises a sheet of electrically resistive material having an electrical resistance of between about 7 and about 40 Ohms/cm. Slowing the rate of change of voltage potential decreases or eliminates the likelihood of electrical arcing or corona discharge when the monitoring device 200 is secured to the electrical conductor 202. As described above, certain aspects of the present invention include providing a ground reference point for the circuitry enclosed in the housing 260 based on an electrical coupling to the conductor 202. To this end, the ground reference point of the circuitry enclosed in the housing 260 may be coupled to the conductor 202 via the pad of semi-conductive material.

Figure 3A:
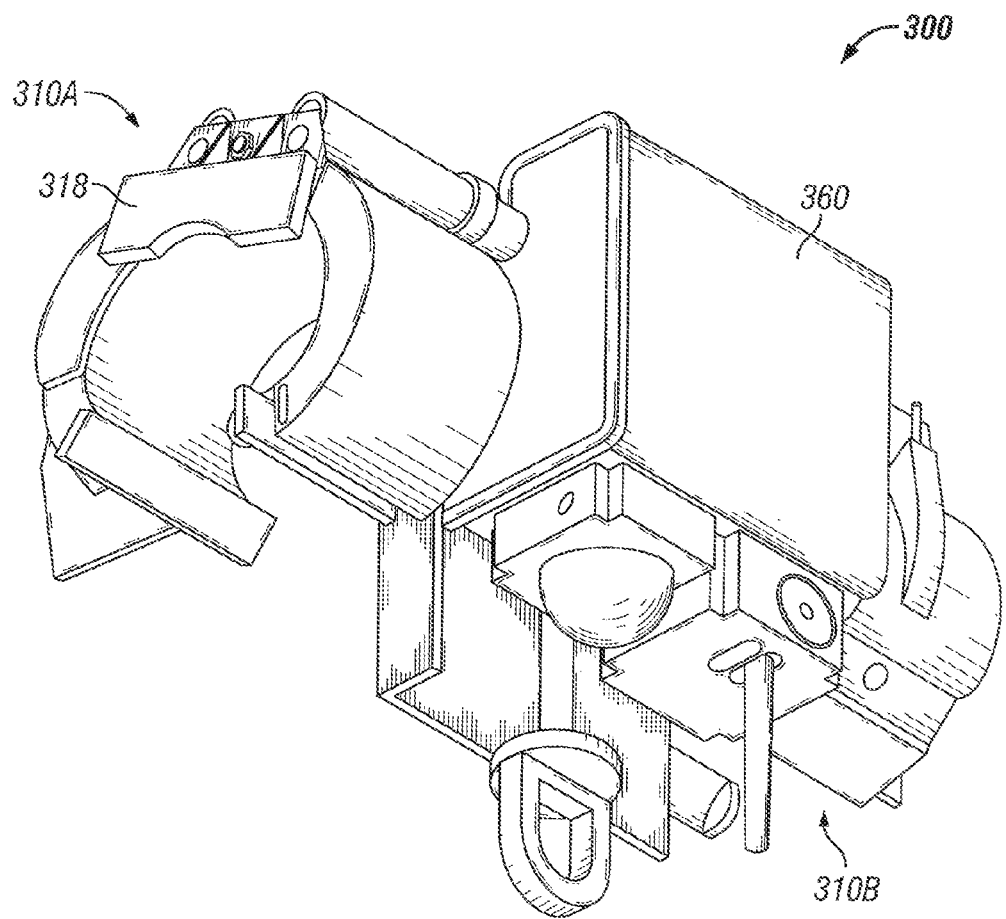
FIG. 3A illustrates a bottom view of a monitoring device according to an embodiment of the present invention.
Figure 3B:
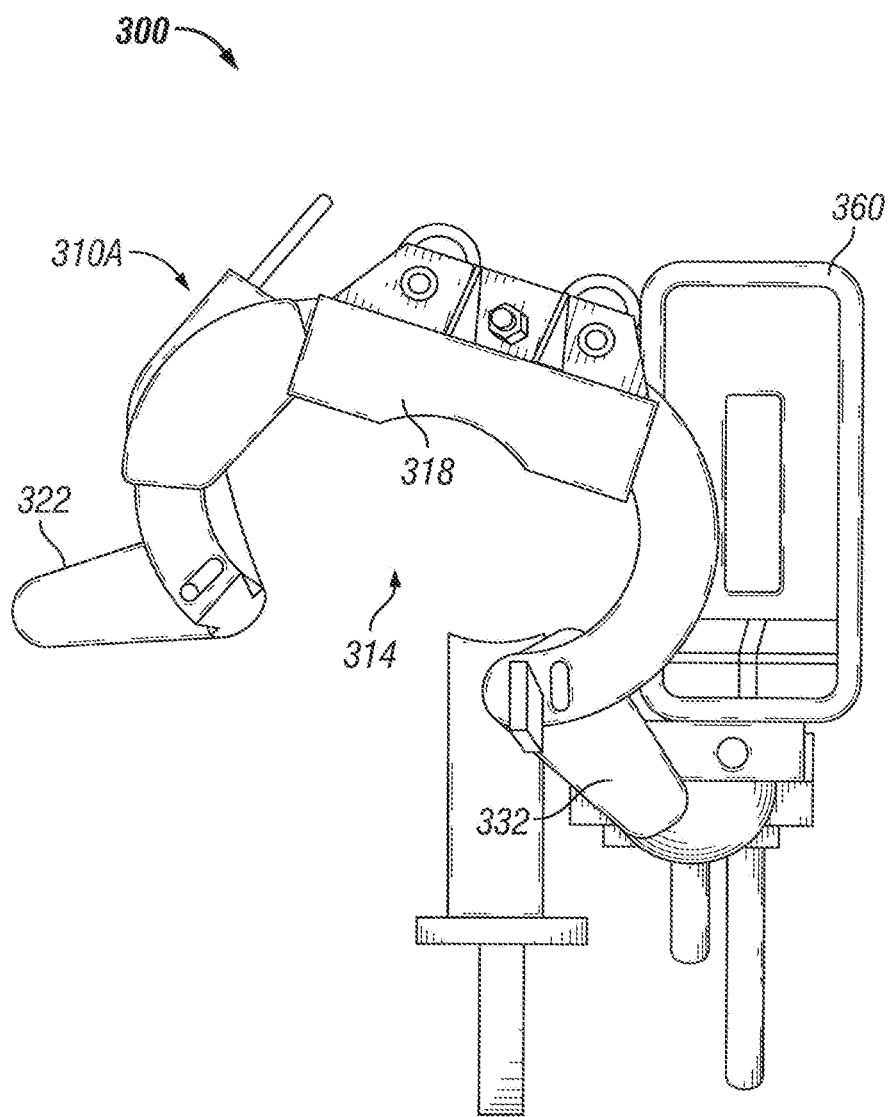
FIG. 3B illustrates a side view of a monitoring device according to an embodiment of the present invention.

Turning now to FIGS. 3A and 3B, a physical structure of a monitoring device 300 according to another embodiment of the present invention is described in detail. FIG. 3A illustrates a perspective view from a position below the monitoring device 300, and FIG. 3B illustrates a side view of the monitoring device 300.

According to the example embodiment illustrated among FIGS. 3A and 3B, the monitoring device 300 includes current transformers 310A and 310B attached to a housing 360. It is noted that the CTs 310A and 310B include elements which are similar to the elements of the CTs 210A and 210B, and the descriptions of those elements are omitted for brevity. The housing 360 may enclose circuitry in a manner similar to the housing 260. In these aspects, the monitoring device 300 is similar to the monitoring device 200 except that the arrangement and attachments among the CTs 310A and 310B and the housing 360 is different than the arrangement and attachments among the CTs 210A and 210B and the housing 260. Thus, as compared to the monitoring device 200, when the monitoring device 300 is mounted on a conductor, the housing 360 of the monitoring device 300 may hang beside the conductor rather than below the conductor.

To install the monitoring device 300 on a conductor, a field technician may move the monitoring device 300 using a hotstick to a position above the conductor, so that the conductor is at a position between the entry projections 322 and 332 of the CTs 310A and 310B. The monitoring device 300 may then be further moved (i.e., pulled down) so that the conductor presses between the entry projections 322 and 332, causing the CTs 310A and 310B to open against a spring bias of the CTs 310A and 310B and the conductor may enter a CT cavity 314 (see FIG. 3B) of the CTs 310A and 310B. It is noted that the monitoring device 300 may not be additionally secured to the conductor with any clamp or securing means, as the weight of the monitoring device 300 is transferred to the conductor at a position away from where the CTs 310A and 310B open, such as at the end plate 318.

Figure 4:
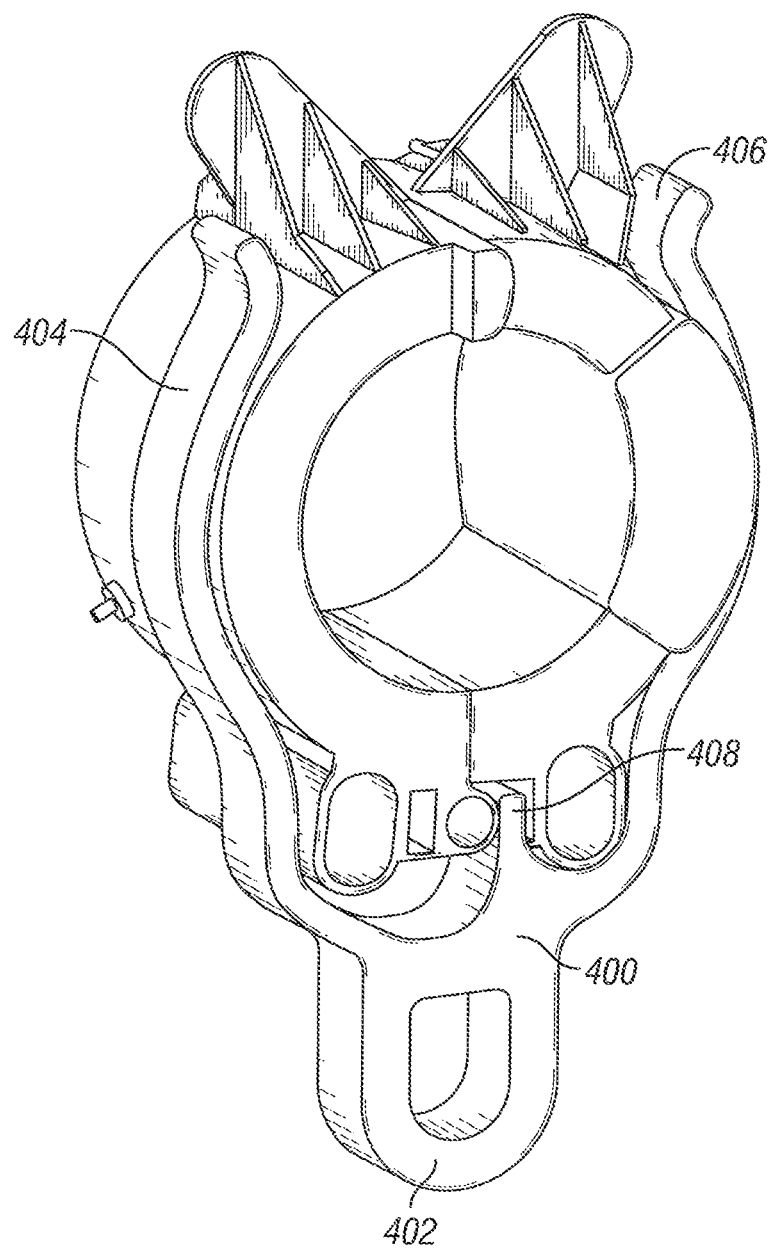
FIG. 4 illustrates a current transformer clip according to aspects of the present invention.

Turning to FIG. 4, a clip 400 for maintaining a CT in a closed position is illustrated. The clip 400 includes two arms 404 and 406 and a pivot stop 408. The two arms 404 and 406 are each formed having a curved shape that wraps around and attaches to a CT. In other words, the arms 404 and 406 may be formed to have a curve according to a shape of a CT upon which the clip is to be attached. In the example embodiment of the clip 400 illustrated in FIG. 4, the clip 400 is formed to be used with the CTs 210A, 210B, 310A, and 310B. Upon a field technician securing one of the CTs 210A, 210B, 310A, and 310B to an electrical connector, the field technician may additionally place the clip 400 over the CT using a clip eye 402 of the clip 400 and a hotstick without de-energizing the conductor, to prevent the CT from opening and releasing the electrical conductor. Thus, the clip 400 is designed to secure a CT in addition to any spring bias that may already maintain the CT in a closed position. It is also noted that the pivot stop 408 may extend between elements of a CT to prevent the CT from pivoting to an open position. The clip 400 may be formed from any material having tensile strength suitable for the application, such as a synthetic plastic or semi-synthetic plastic solid material or other material known in the art to be suitable for the application.

Figure 5A:
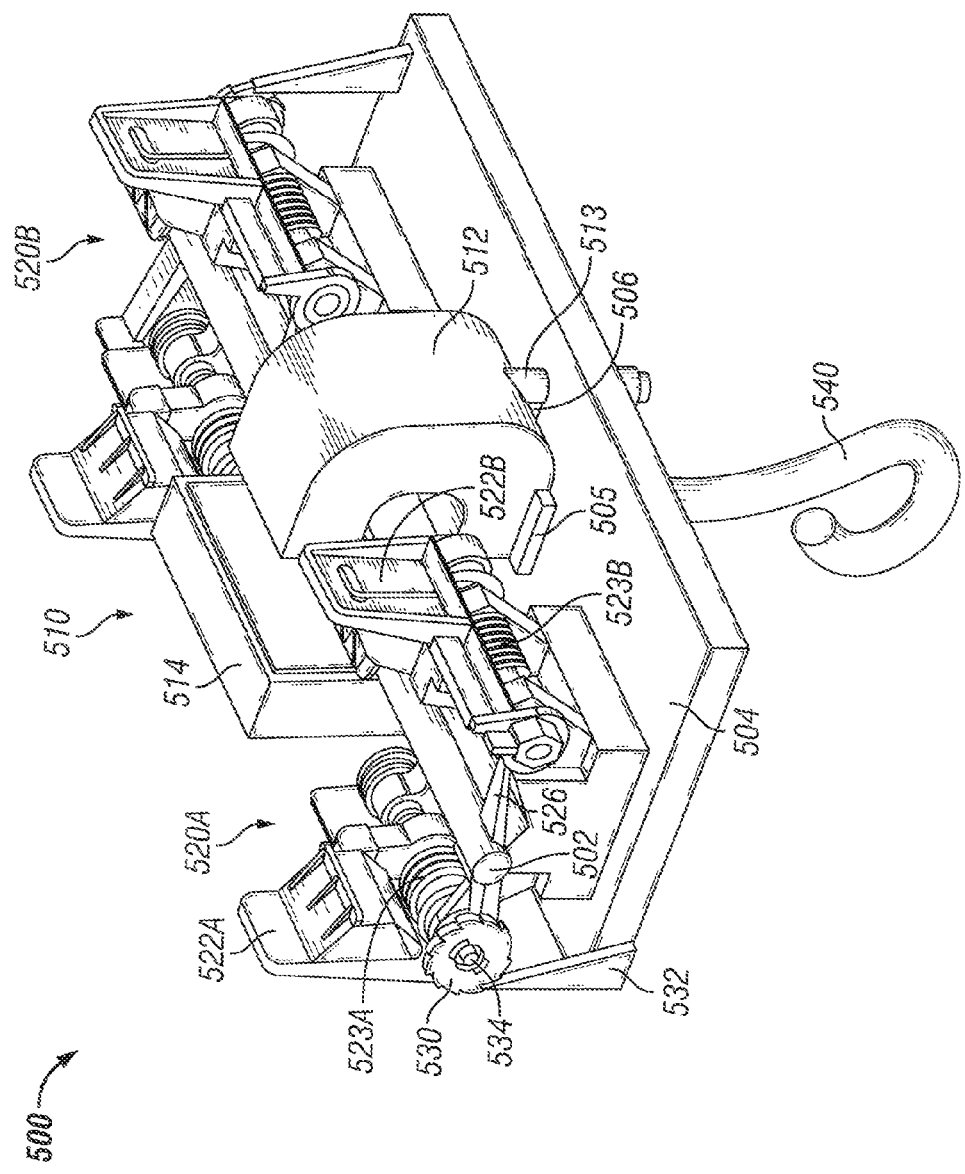
FIG. 5A illustrates a top view of a monitoring device according to an embodiment of the present invention.
Figure 5B:
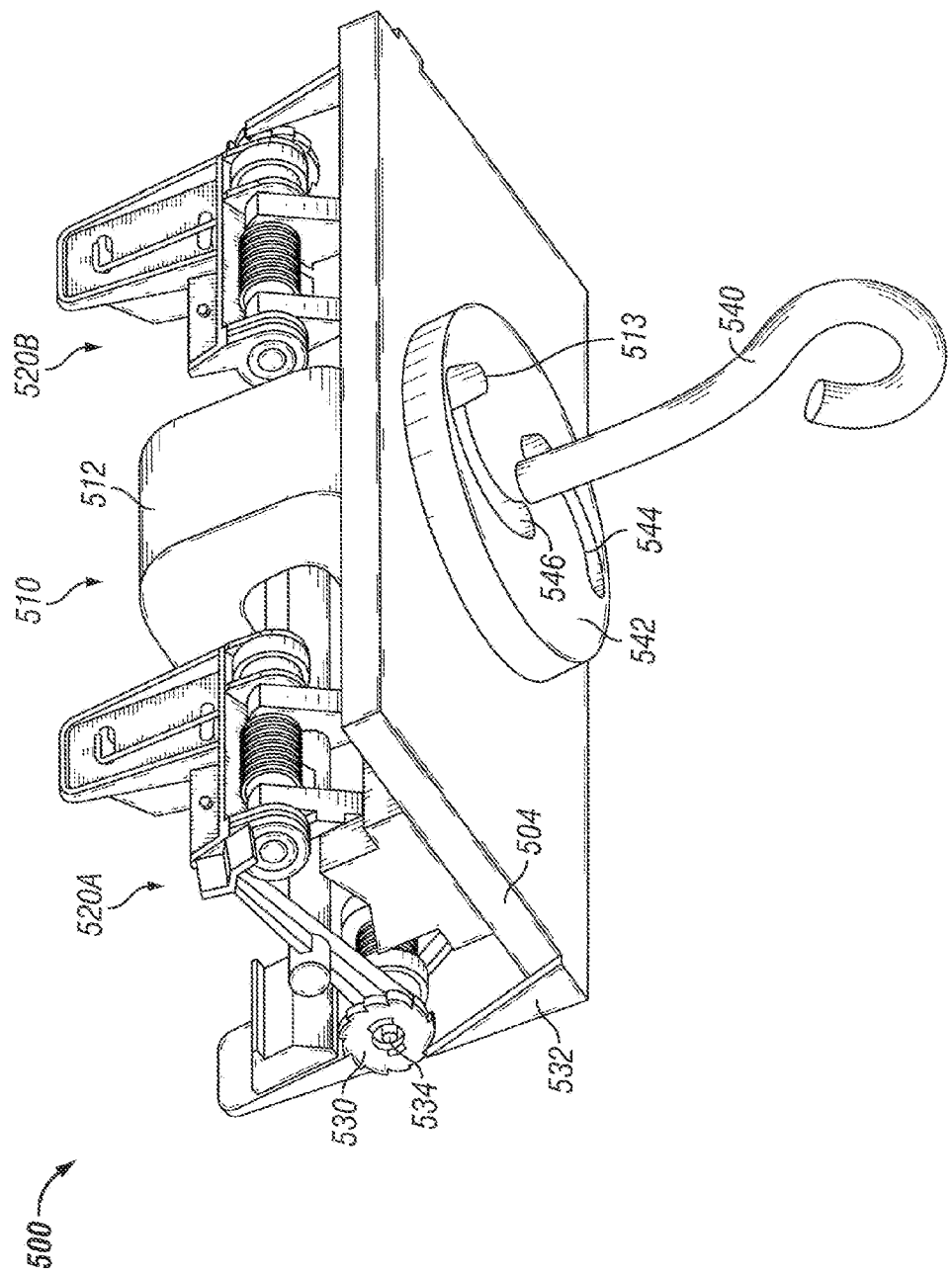
FIG. 5B illustrates a bottom view of a monitoring device according to an embodiment of the present invention.

Turning to FIGS. 5A and 5B, a physical structure of a monitoring device 500 according to another embodiment of the present invention is described in detail. FIG. 5A illustrates a perspective view of a top of the monitoring device 500, and FIG. 5B illustrates a perspective view of a bottom of the monitoring device 500.

The monitoring device 500 includes a CT 510 and wire clamps 520A and 520B mounted upon an attachment plate 504. The CT 510 includes magnetic cores 512 and 514. The cores 512 and 514 are configured to be opened and closed when an adjustment rod 540 is twisted. More specifically, as illustrated at FIG. 5A, core 512 includes a post 513 projecting from one side of the core 512 that passes through an elongated through-channel 506 in the attachment plate 504. As illustrated at FIG. 5B, the post 513 further passes through a curved through-channel 546 of an adjustment plate 542. The adjustment plate 542 is attached to one end of the adjustment rod 540. In one embodiment, an end tip of the post 513 is formed to be pressed though the through-channel 506 of the attachment plate 504 and the through-channel 546 of the adjustment plate 542, where the post 513 locks into position at one side of the adjustment plate 542 based on a locking rib or other means at the end tip of the post 513. It is noted that the core 514 additionally includes a post projecting from one side that is formed to be pressed though a though-channel in the attachment plate and a through-channel 544 of the adjustment plate 542, where the post locks into position at one side of the adjustment plate 542. The adjustment plate 542 is thus locked and secured at a position having one side secured against one side of the attachment plate 504. In this arrangement, the adjustment rod 540 may be twisted to open and close the magnetic cores 512 and 514.

The through-channels 544 and 546 of the adjustment plate 542 are each formed in a curved shape beginning at an outer periphery of the adjustment plate 542 and continuing toward a center of the adjustment plate 542. The through-channels 544 and 546 are formed to have a curved shape such that, when the adjustment rod 540 is twisted, the cores 512 and 514 are directed either toward or apart from each other based upon the direction in which the adjustment rod 540 is twisted. More specifically, according to the example embodiment illustrated in FIGS. 5A and 5B, when the adjustment rod 540 is twisted in a clockwise direction, the curved shape of the through-channels 544 and 546 direct the cores 512 and 514 toward the center of the adjustment plate 542. It is further noted that the elongated through-channels of the attachment plate 504 may be formed to be substantially straight so that, when the adjustment rod 540 is twisted in the clockwise direction, the curved shape of the through-channels 544 and 546 directs the cores 512 and 514 toward a center of the adjustment plate 542 while the through-channels of the attachment plate 504 maintain movement of the cores 512 and 514 in one direction. A directional mount 505 may be formed to additionally secure the core 512 to the attachment plate 504 and guide the core when opening an closing the CT 510. An additional guide (not show) may be formed for the core 514. When the adjustment rod 540 is twisted in a counter-clockwise direction, the curved shape of the through-channels 544 and 546 directs the cores 512 and 514 toward the periphery of the adjustment plate 542, moving the cores 512 and 514 apart.

The wire clamp 520A includes wire clamp arms 522A and 522B configured to snap closed when an electrical conductor 502 displaces an actuator arm 526. Each wire clamp arm 522A and 522B is spring biased to be closed according to springs 523A and 523B, respectively. The wire clamp arms 522A and 522B may be maintained in an open position using the actuator arm 526 that holds the wire clamp arms 522A and 522B open against the spring bias. The wire clamp 520B includes the same elements as the wire clamp 520A. It is noted that the monitoring device 500 may include additional or fewer wire clamps among embodiments of the present invention. The wire clamps 520A and 520B also include additional elements similar to the elements of the clamping mechanism 630 disclosed in U.S. patent application Ser. Nos. 12/569,343 and 12/569,446, and the descriptions and functions of those elements are omitted for brevity.

As compared to the clamping mechanism 630 disclosed in U.S. patent application Ser. Nos. 12/569,343 and 12/569,446, the wire clamp 520A further includes a ratchet head 530 attached at a pivot point 534 of the wire clamp arm 522A and a ratchet arm 532 attached to the attachment plate 504. The ratchet head 530 and ratchet arm 532 function to lock the wire clamp 520A in a closed position. To that end, the ratchet head 530 includes a plurality of teeth arranged on a peripheral edge of the ratchet head 530 which displace a tip of the ratchet arm 532 when moved across the tip in one direction and lock against the tip of the ratchet arm 532 when moved in another direction. In this arrangement, when the wire clamp arm 522A closes, the teeth of the ratchet head 530 displace the ratchet arm 532 to close according to the spring bias and, when the wire clamp arm 522A is closed, the teeth of the ratchet head 530 lock against the ratchet arm 532. It is noted that, to open the wire clamp 520A, the ratchet arm 532 may be pulled away from the ratchet head 530. It is also noted that the wire clamp 520A may include a ratchet head and arm for the clamp arm 522B, and that the wire clamp 520B may also include at least one ratchet head and arm, as illustrated in FIG. 5A.

To install the monitoring device 500 on the conductor 502, a field technician may open the CT 510 by fully twisting the adjustment rod 540 in a counter-clockwise direction to separate the cores 512 and 514, open the wire clamps 520A and 520B, and secure the actuation arm of each wire clamp 520A and 520B to maintain the wire clamps in the open position. The field technician may then move the monitoring device 500 using a hotstick to a position such that the conductor 502 displaces the actuation arms of the wire clamps 520A and 520B. When the actuation arms are displaced, the wire clamps 520A and 520B will snap closed around the conductor 502 according to the spring bias of the wire clamps, securing the monitoring device 500 to the conductor 502. The field technician may then twist the adjustment rod 540 in a clockwise direction to close the cores 512 and 514 around the conductor 502. Once the cores 512 and 514 are closed around the conductor 502, magnetic flux may be coupled to an electrical wire winding wrapped around one or both of the cores 512 and 514 to capture a proportional current induced based on current flowing in the conductor 502. Although not illustrated, the monitoring device 500 may also be associated with sensors, radios, and other circuitry for monitoring conditions of the electrical conductor 502.

Figure 6:
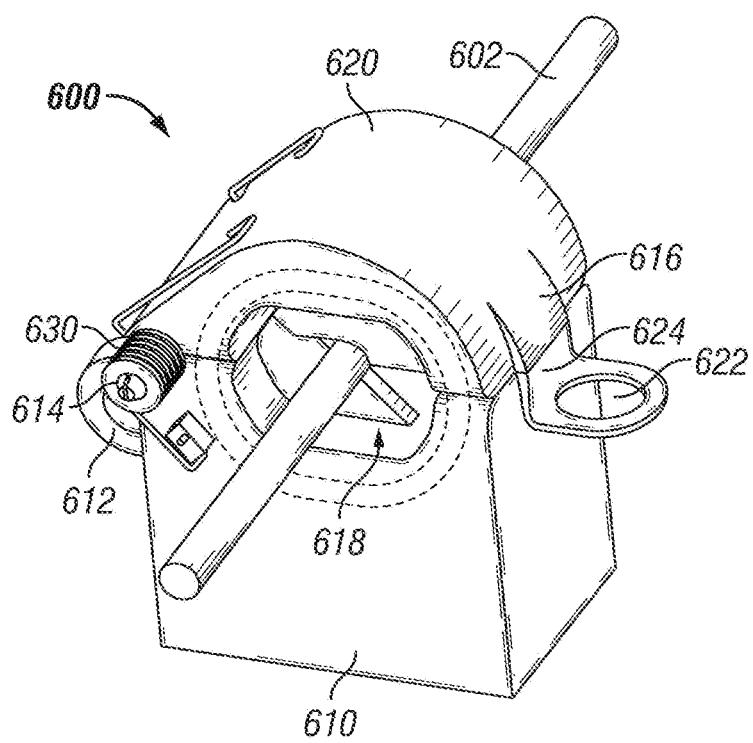
FIG. 6 illustrates a perspective view of a monitoring device according to an embodiment of the present invention.

Turning to FIG. 6, a physical structure of a monitoring device 600 according to another embodiment of the present invention is described in detail. The monitoring device 600 includes a main housing 610 and housing cap 620 that pivots about a pivot point 614. The housing cap 620 is spring biased to a closed position by the spring 630, which is mounted about the pivot point 614. The housing cap 620 further includes a tab 622 and a receptacle 624. When the housing cap 620 is at a closed position with respect to the main housing 610, the receptacle 624 locks over a locking tab 616 of the main housing 610 to maintain the housing cap 620 in the closed position. The monitoring device 600 further includes a mounting ring 612 formed to support the monitoring device 600 when mounting.

The monitoring device 600 includes a portion of a magnetic core in the housing cap 620 and another portion of a magnetic core in the main housing 610. Together, the magnetic cores surround a cavity 618 of the monitoring device 600 where a conductor 602 may extend through. Thus, when the monitoring device 600 is mounted on the conductor 602, magnetic flux may be coupled to an electrical wire winding wrapped around one or both of the cores to capture a proportional current induced based on current flowing in the conductor 602. The main housing 610 may enclose associated circuitry such as the circuitry 104 described above for monitoring conditions of the electrical conductor 602.

To install the monitoring device 600 on the conductor 602, a field technician may open the monitoring device 600 by unlocking the receptacle 624 from the locking tab 622 and opening the housing cap 620 against the spring bias provided by the spring 630. The monitoring device 600 may then be positioned by a field technician using a hotstick. More specifically, the housing cap 620 may be held open and the monitoring device 600 may be positioned such that the main housing 610 is below the conductor 602 using one or more hotsticks, and the housing cap 620 may be released to close according to the spring bias, enclosing the conductor within a cavity 618 of the monitoring device 600. Once the cores within the monitoring device are closed around the conductor 602, magnetic flux may be coupled to an electrical wire winding wrapped around one of the cores to capture a proportional current induced based on current flowing in the conductor 602.

Figure 7:
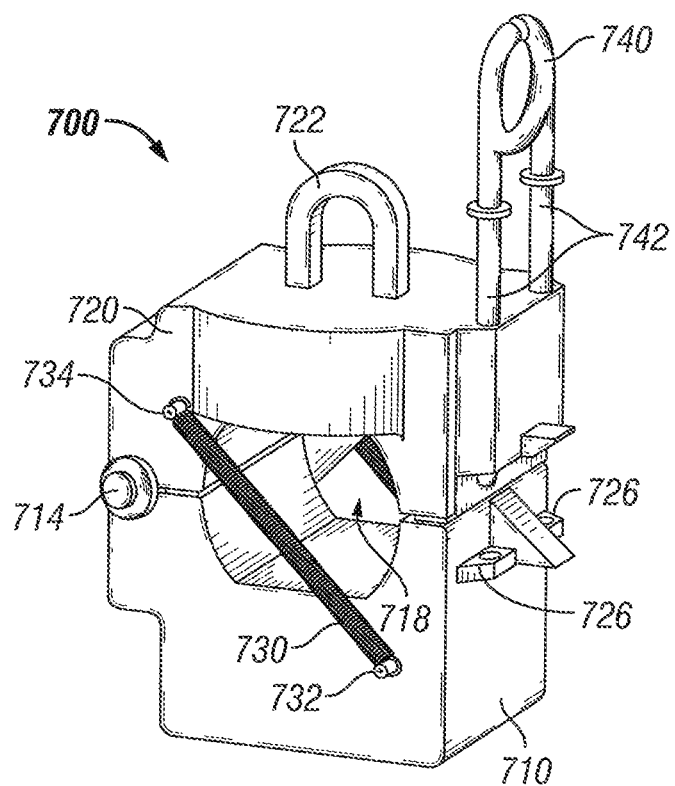
FIG. 7 illustrates a perspective view of a monitoring device according to an embodiment of the present invention.

Turning to FIG. 7, a physical structure of a monitoring device 700 according to another embodiment of the present invention is described in detail. The monitoring device 700 includes a main housing 710 and housing cap 720 that pivots about a pivot point 714. The housing cap 720 is spring biased to a closed position by a spring 730 which is mounted to mounting posts 732 and 734 on one side of the monitoring device 700. As illustrated in FIG. 7, the monitoring device 700 may include springs mounted on both sides of the monitoring device 700. In the example embodiment illustrated in FIG. 7, a locking pin 740 passes though the housing cap 720 at an end apart from the pivot 714. The locking pin 740 includes two elongated rods 742 having sufficient length to reach locking receptacles 726 of the main housing 710. When the housing cap 720 is at a closed position with respect to the main housing 710, the locking pin 740 may be moved (i.e., slid) into a position such that tips of the elongated rods 742 lock into the receptacles 726 of the main housing 710 to maintain the housing cap 720 in the closed position. The housing cap 720 further includes a mounting ring 722 formed to support the monitoring device 700 when mounting.

The monitoring device 700 includes a portion of a magnetic core in the housing cap 720 and another portion of a magnetic core in the main housing 710. Together, the magnetic cores surround a cavity 718 of the monitoring device 700 where a conductor may extend through. Thus, when the monitoring device 700 is mounted on the conductor, magnetic flux may be coupled to an electrical wire winding wrapped around one of the cores to capture a proportional current induced based on current flowing in the conductor. The main housing 710 may enclose associated circuitry such as the circuitry 104 described above for monitoring conditions of a conductor. A ground or reference node of the circuitry may be coupled to the conductor via the spring 730.

To install the monitoring device 700 on a conductor, a field technician may open the monitoring device 700 by pulling the locking pin 740 to remove the elongated rods from the receptacles 726. The field technician may then open the housing cap 720 against the spring bias provided by the spring 730. The housing cap 720 may be held open and the monitoring device 700 may be positioned such that the main housing 710 is below the conductor using one or more hotsticks, and the housing cap 720 may be released to close according to the spring bias, enclosing the conductor within the cavity 718 of the monitoring device 700. Once the cores within the monitoring device 700 are closed around the conductor, magnetic flux may be coupled to an electrical wire winding wrapped around one of the cores to capture a proportional current induced based on current flowing in the conductor.

As described above with regard to the monitoring device 200, any of the monitoring devices 300, 500, 600, and 700 may experience a significant change in voltage potential when secured to an electrical conductor. An abrupt change in voltage potential can cause arcing, which can be harmful to a monitoring device. Thus, in certain embodiments, a pad of semi-conductive or resistive material may be fixed to the monitoring devices at a position where an electrical conductor is likely to touch the monitoring devices, to reduce or slow a change in electrical potential when the monitoring devices are secured to the electrical conductor. For example, the pad of semi-conductive material may be placed at any position of the monitoring devices likely to make contact with the electrical conductor. In some embodiments, the semi-conductive pad comprises a sheet of electrically resistive material having an electrical resistance of between about 7 and about 40 Ohms/cm. As described above, certain aspects of the present invention include providing a ground reference point for circuitry associated with the monitoring devices based on an electrical coupling to an electrical conductor. To this end, the ground reference point of the circuitry may be coupled to an electrical conductor via the pad of semi-conductive material.

Although specific embodiments have been described above in detail, the description is merely for purposes of illustration. It should be appreciated, therefore, that many aspects of the invention were described above by way of example only and are not intended as required or essential elements of the invention unless explicitly stated otherwise. Various modifications of, and equivalent steps corresponding to, the disclosed aspects of the exemplary embodiments, in addition to those described above, can be made by a person of ordinary skill in the art, having the benefit of this disclosure, without departing from the spirit and scope of the invention defined in the following claims, the scope of which is to be accorded the broadest interpretation so as to encompass such modifications and equivalent structures.

What is claimed is:

1. An apparatus for collecting power from an electrical conductor, comprising:
   a housing including a cavity that encloses a circuitry that monitors conditions of the electrical conductor;
   a plurality of current transformers each comprising a magnetic core that receives an induced magnetic flux generated according to alternating current present on the electrical conductor, each of the plurality of current transformers being secured to a respective side of the housing,
      wherein the magnetic core of each current transformer includes a first arm section and a second arm section that are spring biased using one or more springs to remain in a closed position,
      wherein the first arm section and the second arm section of each current transformer is at least partially separable at a portion of the current transformer by applying a force against the spring bias at the partially separable portion, and
      wherein each of the first arm section and the second arm section of each current transformer includes one half of the magnetic core; and
   a clamping mechanism that attaches to the electrical conductor.

2. The apparatus of claim 1, wherein the circuitry includes one or more sensors and indicators.

3. The apparatus of claim 2, further comprising:
   an energy storage device,
      wherein each of the plurality of current transformers further includes an electrical winding that receives an induced current from the induced magnetic flux generated according to alternating current present on the electrical conductor, and
      wherein the circuitry further includes a circuit configured to convert the induced current into energy to be stored in the energy storage device for consumption by the one or more sensors and indicators.

4. The apparatus of claim 1, further comprising at least one clip that secures the first and second arm sections of at least one of the plurality of current transformers in a locked position.

5. The apparatus of claim 1, wherein the clamping mechanism comprises a wire clamp including clamp arms.

6. An apparatus for collecting power from an electrical conductor, comprising:
   a housing including a cavity;
   a current transformer comprising a core and a winding that receives an induced current from magnetic flux generated according to alternating current present on the electrical conductor;
   a clamping mechanism that attaches to the electrical conductor,
      wherein the clamping mechanism includes a securing lever,
      wherein the securing lever is adjustable between an open position and a closed position by engaging an eye formed on one end of the securing lever,
      wherein in the open position the securing lever is substantially parallel to the electrical conductor and in the closed position the securing lever is substantially perpendicular to the electrical conductor such that the apparatus rests on the electrical conductor at the securing lever and the electrical conductor is disposed between the securing lever and the housing; and
   a circuitry disposed within the cavity of the housing that monitors conditions of the electrical conductor, the circuitry including a circuit configured to convert the induced current into energy to be stored in an energy storage device for consumption by one or more sensors and indicators.

7. The apparatus of claim 6, wherein the current transformer comprises first and second magnetic core sections, the first and second magnetic core sections being separable.

8. The apparatus of claim 7, wherein the current transformer includes one or more springs to spring bias the first and second magnetic core sections to a closed position.

9. The apparatus of claim 6, further comprising at least one clip that secures the first and second magnetic core sections of the current transformers in a locked position.

10. The apparatus of claim 6, wherein the clamping mechanism further comprises a bumper post disposed adjacent the securing lever, and wherein the bumper post is configured to and disposed such that it prevents an over rotation of the securing lever past the closed position.

11. An apparatus for collecting power from an electrical conductor, comprising:
   a first current transformer and a second current transformer, each current transformer comprising a first section and a second section, the first and second sections hingedly coupled to each other via a base portion and separable from a tip portion,
      wherein each of the first and second current transformers receives an induced current from magnetic flux generated according to alternating current present on the electrical conductor retained in a cavity defined by the first and second sections of each current transformer; and
   a housing enclosing circuitry which enables monitoring and sensing of one or more conditions of the electrical conductor via the first and second current transformers, wherein the first current transformer is disposed on a first side of the housing and the second current transformer is disposed on a second side of the housing opposite the first current transformer; and
   a securing lever coupled to the housing and disposed adjacent a portion in between the first current transformer and the second transformer,
      wherein the securing lever is adjustable between an open position and a closed position by engaging an eye formed on one end of the securing lever,
      wherein in the open position the securing lever is substantially parallel to the electrical conductor and in the closed position the securing lever is substantially perpendicular to the electrical conductor.

12. The apparatus of claim 11, wherein the first and second sections each comprise an angled tip, wherein the angled tips are biased closed by a spring in the base portion and separated when the electrical conductor is pushed therebetween and into the first and second current transformers.

13. The apparatus of claim 11, wherein the apparatus hangs from the electrical conductor at the securing lever.

14. The apparatus of claim 13, wherein the housing hangs below the electrical conductor when the apparatus is suspended on the electrical conductor.

* * * * *